US011493763B2

(12) United States Patent
Lee et al.

(10) Patent No.: US 11,493,763 B2
(45) Date of Patent: Nov. 8, 2022

(54) ELECTRONIC DEVICE INCLUDING HEAT RADIATING MEMBER

(71) Applicant: Samsung Electronics Co., Ltd., Gyeonggi-do (KR)

(72) Inventors: Yunguk Lee, Gyeonggi-do (KR); Minhyuk Nam, Gyeonggi-do (KR); Seungnyun Kim, Gyeonggi-do (KR); Yongsang Yun, Gyeonggi-do (KR)

(73) Assignee: Samsung Electronics Co., Ltd

( * ) Notice: Subject to any disclaimer, the term of this patent is extended or adjusted under 35 U.S.C. 154(b) by 292 days.

(21) Appl. No.: 16/859,324

(22) Filed: Apr. 27, 2020

(65) Prior Publication Data

US 2020/0379257 A1 Dec. 3, 2020

(30) Foreign Application Priority Data

May 31, 2019 (KR) .................. 10-2019-0064743

(51) Int. Cl.
*G02B 27/01* (2006.01)
*H05K 7/20* (2006.01)
(Continued)

(52) U.S. Cl.
CPC ....... *G02B 27/0172* (2013.01); *G02B 6/0088* (2013.01); *G02B 27/0176* (2013.01);
(Continued)

(58) Field of Classification Search
CPC ............ G02B 27/0172; G02B 27/0176; G02B 6/0088; G02B 2027/0178; H05K 5/0017; H05K 7/20963
See application file for complete search history.

(56) References Cited

U.S. PATENT DOCUMENTS 9,740,023 B1 8/2017 Ashwood
2011/0214082 A1* 9/2011 Osterhout ............ G02B 27/017
715/773
(Continued)

FOREIGN PATENT DOCUMENTS

JP 2008-99222 4/2008
JP 2017-098649 6/2017
(Continued)

OTHER PUBLICATIONS

International Search Report dated Jun. 9, 2020 issued in counterpart application No. PCT/KR2020/002593, 8 pages.

*Primary Examiner* — Stephen G Sherman
(74) *Attorney, Agent, or Firm* — The Farrell Law Firm, P.C.

(57) ABSTRACT

An electronic device is provided, which includes a display member including at least one piece of glass, a housing surrounding at least a portion of the display member to form a space inside the electronic device, a mounting member coupled to at least one side of the housing, a light output device disposed inside the mounting member to output light to the display member, a light refracting member refracting light emitted from the light output device, and a heat radiating member including at least a first portion disposed adjacent to the light output device and at least second portion extending to the housing to surround at least a portion of the at least one piece of glass, wherein at least a part of the heat radiating member contacts the space.

18 Claims, 13 Drawing Sheets

(51) Int. Cl.
*H05K 5/00* (2006.01)
*F21V 8/00* (2006.01)

(52) U.S. Cl.
CPC ....... *H05K 5/0017* (2013.01); *H05K 7/20963* (2013.01); *G02B 2027/0178* (2013.01)

(56) References Cited

U.S. PATENT DOCUMENTS

| | | |
|---|---|---|
| 2016/0212879 A1 | 7/2016 | Nikkhoo et al. |
| 2016/0212886 A1* | 7/2016 | Nikkhoo ............ H05K 7/20963 |
| 2017/0177239 A1 | 6/2017 | Ono |
| 2018/0172981 A1 | 6/2018 | Ishii |
| 2018/0329452 A1 | 11/2018 | Zhang |

FOREIGN PATENT DOCUMENTS

| | | |
|---|---|---|
| JP | 2017-152955 | 8/2017 |
| JP | 2018-182553 | 11/2018 |

* cited by examiner

ELECTRONIC DEVICE INCLUDING HEAT RADIATING MEMBER

CROSS-REFERENCE TO RELATED APPLICATION(S)

This application is based on and claims priority under 35 U.S.C. § 119 to Korean Patent Application No. 10-2019-0064743, filed on May 31, 2019, in the Korean Intellectual Property Office, the entire disclosure of which is incorporated herein by reference.

BACKGROUND

1. Field

The disclosure relates generally to electronic devices that may be put on or worn on a portion of a human body.

2. Description of Related Art

Portable electronic devices, such as electronic schedulers, portable multimedia players, mobile communication terminals, and tablet personal computers (PCs), are generally equipped with a display member and a battery, and may be limited in shape to a bar, clamshell, or slidable shape by their accompanying displays or batteries. With display members and batteries being made smaller and more compact, electronic devices that are wearable on a user's wrist, head, or another body part are becoming more common.

For improved portability and/or wearability, electronic devices may be reduced in size and in weight, may be designed to resemble a particular shape, and may designed to have a sufficient battery capacity.

Head-mounted wearable devices include virtual reality (VR) glasses and augmented reality (AR) glasses which consist of glasses-shaped frames and a display member fitted to the frames to process virtual objects.

To allow a wearable electronic device to process virtual objects, a light output device may be provided which outputs virtual objects on the display member. The light output device may be a projector. Light emitted from the light output device forms an image on the display member. The user may receive visual information for the virtual object via the image formed on the display member.

To allow the user to obtain clearer visual information, the light output device may emit high-power light, which requires the light output device to include an element for radiating heat generated near the light output device. For example, if the light output device is formed in a side structure of a head-mounted wearable electronic device, heat generated from the light output device may stay near the user's temple, causing discomfort.

For thermal radiation purposes, a heat radiating plate may be placed near the light output device of the electronic device. In such a case, heat radiation occurs mostly in the structure where the light output device is positioned and, resultantly, heat radiation efficiency may be poor.

Additionally or alternatively, a vent hole may be formed near the light output device and heat radiation may be achieved by friction between the heat radiating plate and the external air. To attain a sufficient heat radiation capability, this may require forming multiple holes around the structure where the light output device is located. However, forming multiple holes may deteriorate water-proof/dust-proof capability. As such, a conventional heat radiating element may not provide a sufficient heat radiating capability and may not allow the electronic device to be used for a long duration.

SUMMARY

The disclosure has been made to address the above-mentioned problems and disadvantages, and to provide at least the advantages described below.

In accordance with an aspect of the disclosure, an electronic device includes a display member including at least one piece of glass, a housing surrounding at least a portion of the display member to form a space inside the electronic device, a mounting member coupled to at least one side of the housing, a light output device disposed inside the mounting member to output light to the display member, a light refracting member refracting light emitted from the light output device, and a heat radiating member including at least a first portion disposed adjacent to the light output device and at least a second portion extending to the housing to surround at least a portion of the at least one piece of glass, the heat radiating member including a portion at least partially including the space.

In accordance with another aspect of the disclosure, an electronic device includes a display member, a housing surrounding at least a portion of the display member, a mounting member coupled to at least one side of the housing, a light output device disposed inside at least one side of the mounting member to output light to the display member, a light refracting member refracting light emitted from the light output device to the display member, and a heat radiating member including at least a first portion disposed adjacent to the light output device and at least a second portion extending to the housing to surround a lower end of the display member.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
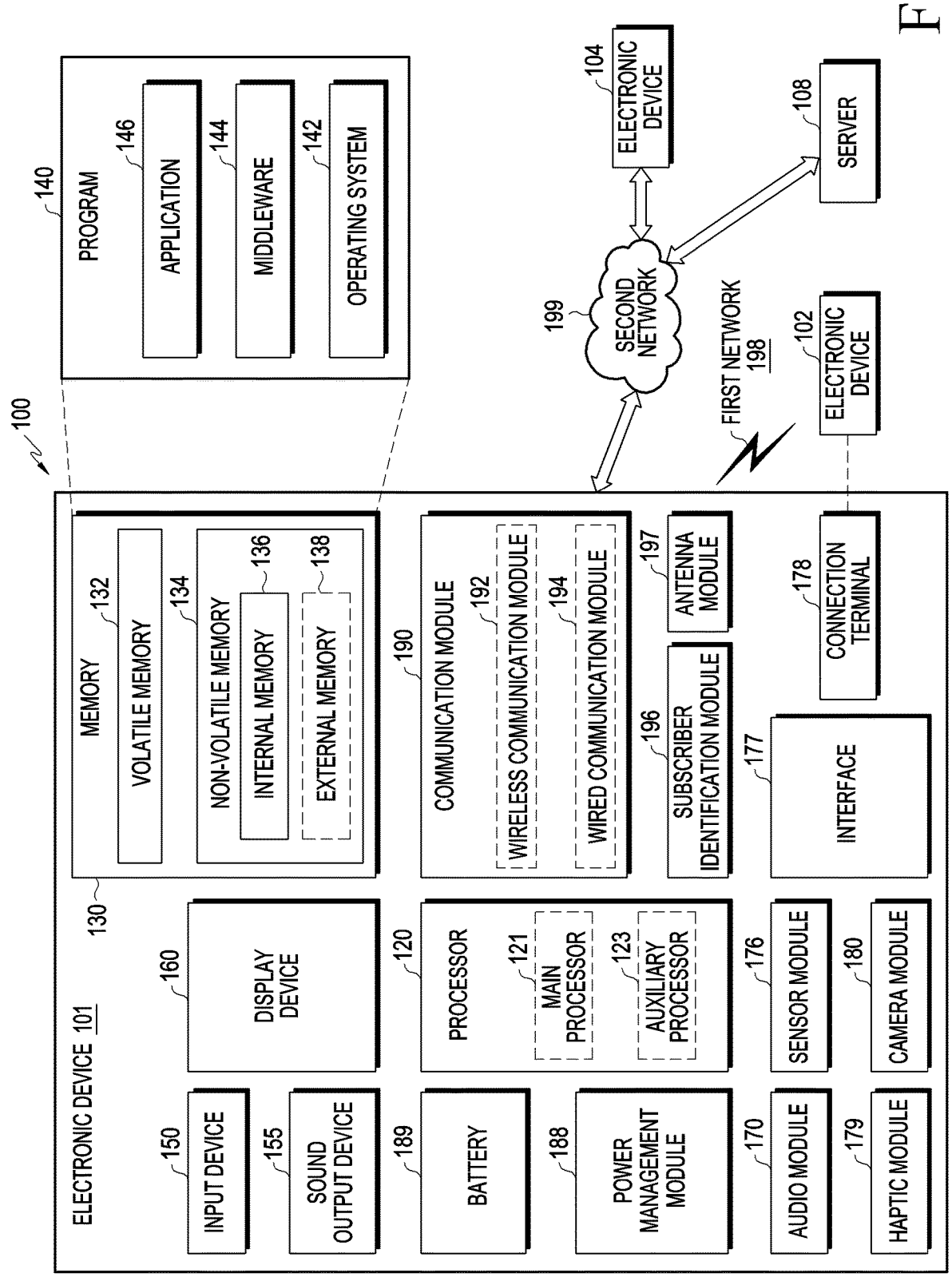
FIG. 1 illustrates an electronic device in a network environment, according to an embodiment.

Various embodiments of the disclosure are described with reference to the accompanying drawings. However, various embodiments of the disclosure are not limited to these particular embodiments, and it should be understood that modifications, equivalents, and/or alternatives of the embodiments described herein can be variously made. With regard to description of drawings, similar components may be marked by similar reference numerals.

According to an embodiment, an electronic device is provided that has a heat radiating member disposed around a display member which provides visual information to a user, thus delivering a higher heat radiating efficiency as compared with prior art.

According to an embodiment, an electronic device is provided that may minimize an influence of heat generated from the light output device on the user.

FIG. 1 illustrates an electronic device 101 in a network environment 100 according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display member 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display member 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display member 160 (e.g., a display).

The processor 120 may execute, e.g., software (e.g., a program 140) to control at least one other component (e.g., a hardware or software component) of the electronic device 101 connected with the processor 120 and may process or compute various data. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one (e.g., the display member 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain a sound through the input device 150 or output a sound through the sound output device 155 or an external electronic device (e.g., an electronic device 102 (e.g., a speaker or a headphone) directly or wirelessly connected with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or wireless communication channel between the electronic device 101 and an external electronic device (e.g., the electronic device 102, the electronic device 104, or the server 108) and performing communication through the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module may include one antenna including a radiator formed of a conductor or conductive pattern formed on a substrate (e.g., a printed circuit board (PCB)). According to an embodiment, the antenna module 197 may include a plurality of antennas. In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The first and second external electronic devices 102 and 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
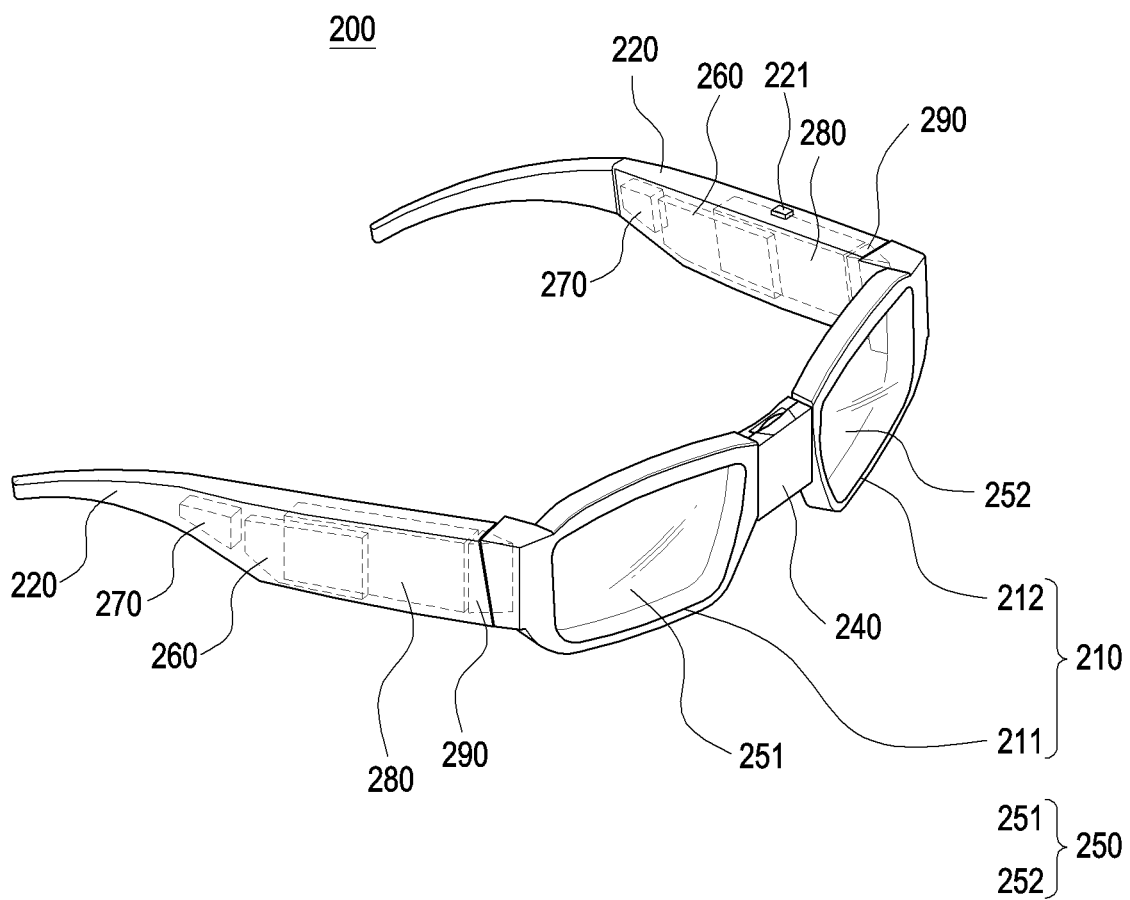
FIG. 2 illustrates a perspective view of an electronic device, according to an embodiment.

FIG. 2 illustrates a perspective view of an electronic device 200, according to an embodiment.

Referring to FIG. 2, the electronic device 200 may be a head-mounted wearable electronic device that includes a frame-shaped housing 210 having a display member 250 fitted in and a pair of mounting members 220 extending parallel from the housing 210.

The electronic device 200 may include an interval adjusting structure 240 inside the housing 210, a circuit board 260, a battery 270, a light output device 280, and a light refracting member 290 in the mounting member 220. The structure of the electronic device 200 of FIG. 2 may be identical in whole or part to the structure of the electronic device 101 of FIG. 1.

The housing 210 may be shaped as a frame that at least partially surrounds the edges of the display members 250 and may serve as the rims of regular glasses. There may be a pair of housings 210 connected with each other via a connecting member 240 with the connecting member 240 interposed therebetween. The pair of housings may include a first housing 211 and a second housing 212.

The display member 250 is a component for providing the user with visual information. The display member 250 may include a lens, a display, and/or touch circuitry. The lens and the display may be formed to be transparent or semi-transparent. The display member 250 may include a window member that may be a semi-transparent glass or a member capable of adjusting its light transmittance depending on the concentration of coloring. The display member 250 may include a reflective lens or a lens including a waveguide. An image output from the light output device may form on each lens, providing the user with visual information.

The electronic device 200 may provide at least one of a see-through function which provides AR or a see-closed function which provides VR using the display member 250. The see-through function may be a function that provides external real-world objects or virtual objects to the user via a visual means while delivering the real-world objects to the user's eyes via a display or a transparent/semi-transparent lens. The use of the see-through function may provide the user with additional information and/or images for objects that are actually seen. The additional information may be provided to the user using a hologram without a display or lens. The see-closed function may be provided by a separate display configured so that the user may view content (e.g., games, movies, streaming, or broadcasts) provided via a display.

The display member 250 may include a first display member 251 at least partially surrounded by the first housing 211 and a second display member 252 at least partially surrounded by the second housing 212. The first display member 251 and the second display member 252 may correspond to the user's right and left eyes, respectively, when the user wears the electronic device 200.

The pair of mounting members 220 may extend in parallel from two opposite ends of the housing 210 to allow the user to put the electronic device 200 on the user's body portion, e.g., head. The pair of mounting members 220 may be positioned along the portion of regular glasses which come into contact with a user's temples when they are worn (a glasses temple). For example, the pair of housings 210 may be positioned on the user's face to position the display members 250 to correspond to the user's eyes, and the pair of mounting members 220 may be hung on the user's ears on both sides of the user's head.

Each mounting member 220 may include a circuit board 260 and a battery 270. A light output device 280 (e.g., a projector) may be included in the mounting members 220 of the electronic device 200. A light refracting member 290 (e.g., a mirror and/or a prism) may be included in the mounting members 220.

If a virtual object is formed via only one of the display members 250, then the circuit board 260, the battery 270, the light output device 280, and/or the light refracting member 290 may be disposed in only one of the mounting members 220 corresponding to the display member 250 which formed the virtual object. Additionally or alternatively, the light output device 280 and the circuit board 260 for controlling the light output device 280 may be disposed in one mounting member 220, the battery 270 may be disposed in the other mounting member 220, and the two mounting members 220 may be electrically connected together via a flexible printed circuit board (FPCB).

Various electronic components may be mounted on the circuit board 260. The circuit board 260 may include a plurality of circuit boards. Circuit wires connecting the electronic parts or the circuit boards may be disposed inside or outside the housing 210. The mounting members 220 may be used in placing the circuit boards 260, the batteries 270, the light output devices 280, and the light refracting member 290. For example, the pair of mounting members 220 each may have a housing structure to receive the circuit board 260, the battery 270, or the light output device 280. The light refracting member 290 may be received in the housing structure of the mounting member 220. The circuit boards 260, batteries 270, light output devices 280, or the light refracting member 290 may be placed in various arrangements considering the weight distribution and wearability of the electronic device 200.

One of the plurality of circuit boards 260 may be provided as a circuit board including a driving circuit of the display member 250, a control circuit for adjusting the concentration of coloring, and a processor for handling image information. Another one of the plurality of circuit boards 260 may be provided as a circuit board equipped with an interface with the user, a communication circuit for providing access to other electronic devices or commercial communication networks, various connectors, and a sensor module 176. Additionally or alternatively, a microphone or speaker for sound input or output may be placed on, or adjacent to, one of the circuit boards 260. The arrangement and functions of the plurality of circuit boards 260 are not limited thereto and various modifications may be made thereto as necessary. For example, a sensor module may be disposed on each of the plurality of circuit boards 260.

The sensor module 176 may include a proximity sensor, an illuminance sensor, a gyro sensor, a camera module, a gaze tracker, a geo-magnetic sensor, or an accelerometer, and various sensors constituting the sensor module 176 are not necessarily placed in one of the plurality of circuit boards 260. For example, the camera module may be placed in a proper position on the pair of housings 210 close to the user's gaze. The sensor module 176 may detect information about the ambient environment necessary for setting the optimal use environment while monitoring the use environment of the electronic device 200. For example, the illuminance sensor equipped in the sensor module 176 may detect the ambient illuminance and provide information necessary for adjusting the concentration of coloring, brightness, or resolution.

The battery 270 may be a component for providing power to various electronic components included in the electronic device 200. The battery 270 may provide power to various electronic components arranged on the circuit board 260 or a module (e.g., a display module) for driving the display member.

The light output device 280, as a component for outputting light to the display member 250, may be disposed inside the mounting member 220. The light refracting member 290 may be disposed in a position adjacent to the light output device 280 and/or the display member 250. Light emitted from the light output device 280 may pass through the light refracting member 290 and reach the display member 250. When the light refracting member 290 is disposed adjacent to the light output device 280 and/or the display member 250, the light refracting member 290 may be disposed to physically touch the light output device 280 and/or the light refracting member 290 may be spaced a predetermined distance apart from the light output device 280 and/or the display member 250.

The electronic device 200 may be divided into a waveguide-type electronic device or a reflective mirror-type electronic device depending on light output methods between the display member 250 and the light output device 280. If the electronic device is a waveguide-type electronic device, light emitted from a side light output device 280, e.g., a projector, may be reflected by the light refracting member 290 (e.g., a prism or another waveguide) to the grating area formed in the display member 250 and thus to the user's eyes. Additionally or alternatively, if the electronic device is a reflective mirror-type electronic device, light emitted from the light output device 280 may be reflected directly to the display member 250 ahead of the user's eye, thereby providing visual information to the user's eye.

The electronic device 200 may include an input unit 221 including a physical key or a touchpad. For example, the input unit 221, such as a power key or touch pad, is a device that requires the user's direct contact and may be exposed to the outside of the housing 210 or mounting member 220 of the electronic device 200.

The connecting member 240 may be disposed between the pair of housings 210 and may be configured to be able to adjust the spacing between the display members 250 based on the user's head shape.

When the circuit boards 260 are disposed in each of the pair of housings 210 or each of the pair of mounting members 220, the circuit boards 260 may be connected together via circuit wires. The circuit lines may provide a transmission/reception path for various control signals and data between the circuit boards 260. The circuit lines may be formed of coaxial cables and have various transmission line structures, e.g., FPCBs.

Figure 3:
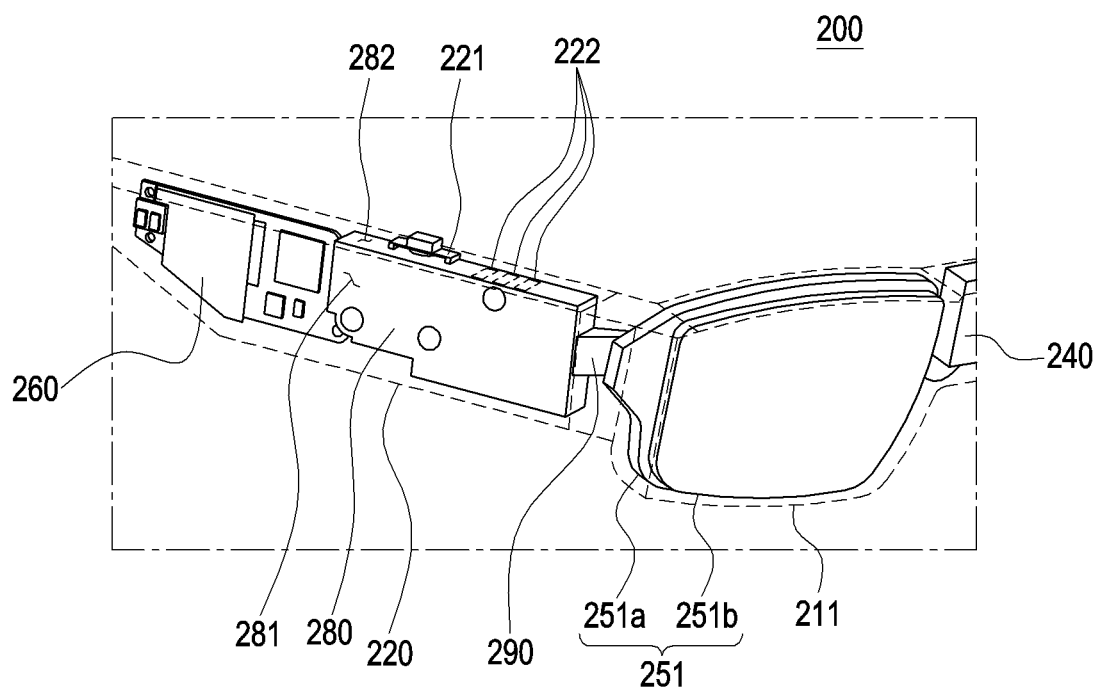
FIG. 3 illustrates a perspective view of an internal configuration of a display member and a mounting member included in an electronic device, according to an embodiment.
Figure 4A:
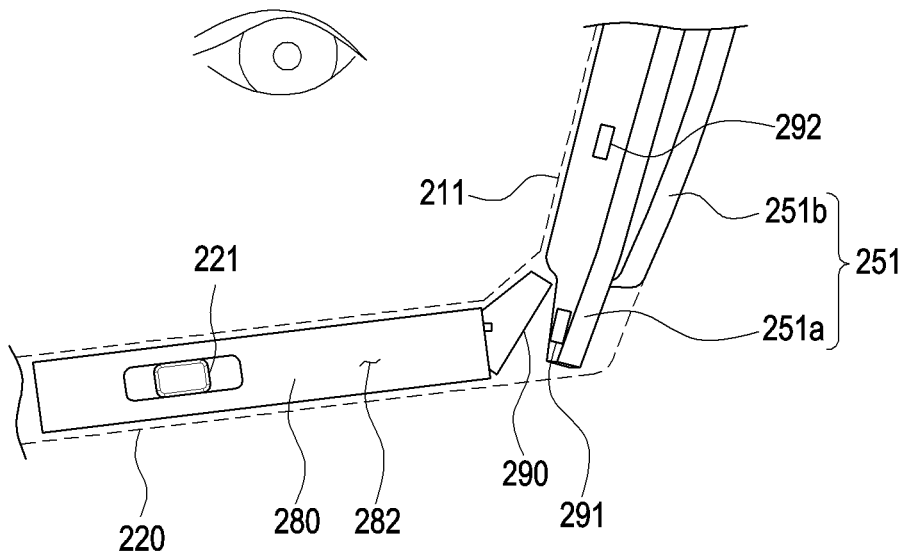
FIG. 4A illustrates a cross-sectional view of an internal configuration of a display member and a mounting member included in an electronic device, according to an embodiment.
Figure 4B:
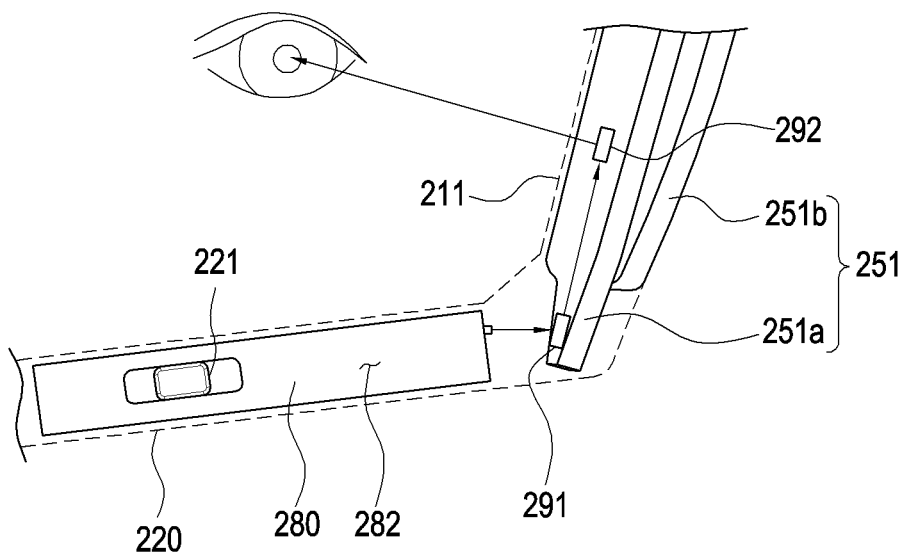
FIG. 4B illustrates a cross-sectional view of an internal configuration of a display member and a mounting member included in an electronic device, according to an embodiment.

FIG. 3 illustrates a perspective view of an internal configuration of a display member 250 and a mounting member 220 included in an electronic device 200, according to an embodiment. FIG. 4A illustrates a cross-sectional view of an internal configuration of a display member 251 and a mounting member 220 included in an electronic device 200, according to an embodiment. FIG. 4B illustrates a cross-sectional view of an internal configuration of a display member 250 and a mounting member 220 included in an electronic device 200, according to an embodiment. The cross-sectional views of FIGS. 4A and 4B may be viewed from above the electronic device 200 of FIG. 3.

Referring to FIG. 3, the internal configuration of the electronic device 200 is described in detail, focusing primarily on the housing 211 and the display member 251. As illustrated in FIG. 2, when the housing 210 includes a first housing 211 and a second housing 212, and the display member 250 includes a first display member 251 and a second display member 252, the description of the first housing 211 and the description of the first display member 251 may apply to the second housing 212 and the second display member 252, respectively.

The first display member 251 may include a first glass 251*a* and a second glass 251*b*. The second glass 251*b* may form a portion of the outer look of the electronic device 200, and the first glass 251*a* may be disposed in a position spaced a predetermined distance apart from one surface of the second glass 251*b*. The first glass 251*a* may, or may not, form a portion of the outer look of the electronic device 200.

Figure 7:
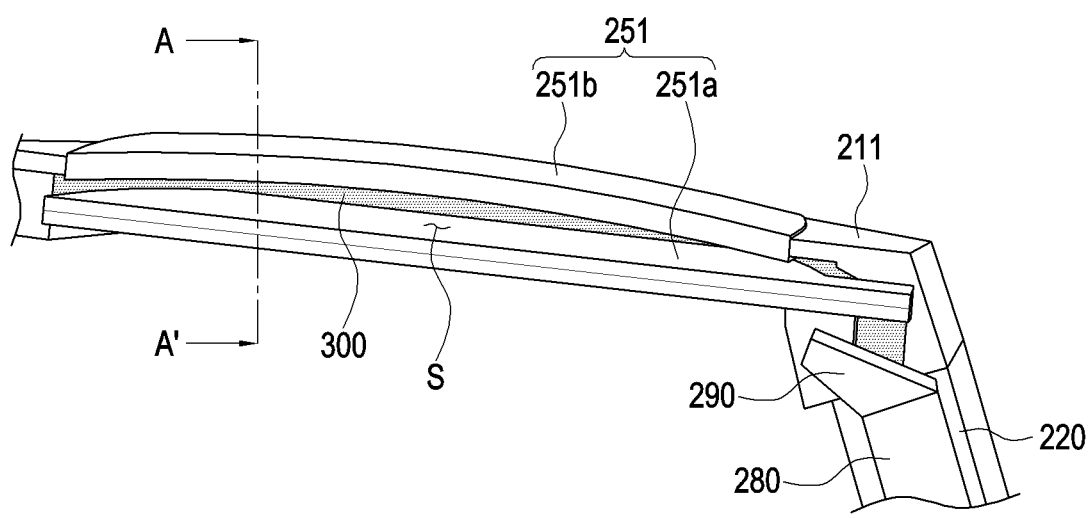
FIG. 7 illustrates a cross-sectional view of glass coupled to a housing of an electronic device, according to an embodiment.

The second glass 251*b* may be provided for giving the electronic device 200 a better look and protecting the first glass 251*a* from external physical impacts, changes in transmittance, and/or contamination. The second glass 251*b* may be formed to be transparent or semi-transparent. The second glass 251*b* may perform polarization. The first glass 251*a* may be a part of the display member 250 for displaying virtual objects, e.g., AR or VR objects. The first glass 251*a* may be formed of an optical waveguide glass including a grating area using the diffraction of light. The first glass 251*a* may be formed as an optical waveguide glass obtained by attaching thin glass plates for grating as shown in FIGS. 3, 4A, and 4B. The first glass 251*a* may be formed by attaching two glass plates as illustrated in FIG. 7.

The first glass 251*a* may include a first surface 251*a*-1 and a second surface 251*a*-2 facing away from the first surface. The first glass 251*a* may include a side end surface 251*a*-3 formed between the first surface and the second surface. If the second glass 251*b* is included, the second glass 251*b* may include a third surface 251*b*-1 and a fourth surface 251*b*-2 facing away from the third surface. The second glass 251*b* may include a side end surface 251*b*-3 formed between the third surface and the fourth surface. Hereinafter, the side end surface of the first glass 251*a* may be referred to as a first side end surface 251*a*-3, and the side end surface of the second glass 251*b* may be referred to as a second side end surface 251*b*-3. The first glass 251*a* and the second glass 251*b* may be shaped to be surrounded by the first housing 211. The first glass 251*a* may be surrounded along the first side end surface 251*a*-3 of the first glass 251*a* by a portion of the first housing 211, and the second glass 251*b* may be surrounded along the second side end surface 251*b*-3 of the second glass 251*b* by another portion of the first housing 211. The first housing 211 may surround the first glass 251a and the second glass 251b, which constitute the first display member 251, and form a space (e.g., S of FIG. 7) between the first glass 251a and the second glass 251b.

The mounting member 220 and the connecting member 240 may be disposed around the first housing 211 or the first display member 251. The mounting member 220 may be disposed at one end of the first housing 211 and may be shaped as a glasses temple to be worn on the user's ear. The connecting member 240 may be disposed at the other end of the first housing 211 and may be a component for connecting the first housing 211 with the second housing 212.

The circuit board 260, the light output device 280, the battery 270, and the light refracting member 290 may be disposed inside the mounting member 220. Since the circuit board 260 and the light output device 280 are disposed in a limited space of the mounting member 220, each component may at least partially overlap at least a portion of the other component.

Referring to FIGS. 3 and 4A, the light refracting member 290 is formed adjacent to one side of the light output device 280. The light refracting member 290 may be disposed at an end of the light output device 280 and may be inclined from one surface of the light output device 280 to the first display member 251. Light emitted from the light output device 280, after passing through the light refracting member 290, may be incident at a designated angle, onto the second surface 251a-2 of the first glass 251a.

The light refracting member 290 may come in various shapes. For example, the light refracting member 290 may be shaped to have a larger width (or height) as illustrated in FIG. 2 or to have a smaller width (or height) as shown in FIG. 3. When the mounting member 220 is in the unfolded position from the first housing 211, light emitted from the light refracting member 290 may be incident onto the first display member 251 at various designated angles. The light refracting member 290 and the first display member 251 may be spaced apart from each other a predetermined distance, with a gap formed therebetween. If the light output device 280 is a projector, light emitted from the light output device 280, after passing through the light refracting member 290, passes through the gap between the light refracting member 290 and the first display member 251, forming an image on the first display member 251. Image formation may occur on the first glass 251a and the second glass 251b of the first display member 251.

The mounting member 220 may be designed to be folded on the first housing 211. FIGS. 3 and 4 illustrate an example in which the mounting member 220 is in the unfolded position on the first housing 211. In this case, light emitted from the light output device 280 may pass through the light refracting member 290 and may then be incident onto the first display member 251 at the designated angle. When the mounting member 220 is in the folded position on the first housing 211, light from the light output device 280 may be incident at a different angle from the designated angle.

It should be noted that FIGS. 3, 4A, and 4B are with reference to the unfolded position of the mounting member 220 on the first housing 211.

As illustrated in FIG. 4A, a plurality of light refracting members may be provided. For example, the electronic device 200 may include a light refracting member 290 disposed adjacent to the light output device 280 and, additionally or instead thereof, the electronic device 200 may include another light refracting member 291 formed adjacent to the first glass 251a. Light emitted from the light output device 280 may be refracted while passing through the light refracting member 290, or additionally or instead thereof, the light may be refracted while passing through the other light refracting member 291.

Referring to FIG. 4B, the light refracting member 290 may be integrated with the first glass 251a so that a portion of the first glass 251a refracts light. Light emitted from the light output device 280, after arriving at the first glass 251a, may be refracted to the inside of the glass. The light refracting member 290 may be formed in the housing 210 between the first glass 251a and the mounting member 220.

The light refracting member 290 may come in various shapes and may be placed in different positions.

Referring to FIGS. 4A and 4B, light refracted by the light refracting member may be reflected by the grating area 292 formed in the first glass 251a to the user's eyes. Referring to FIGS. 3 to 4B, the light output device 280 may be shaped as a cuboid. When the user wears the electronic device 200, the broadest area 281 of the light output device 280 may be designed to face the user's temple. The light output device 280 may include a surface 282 which is disposed adjacent to the broadest area 281 and is elongated in the direction parallel to the lengthwise direction of the mounting member 220. It is shown that a vent hole 222, as well as an input unit 221, is formed in a position adjacent to the surface 282. However, the input unit 221 and the vent hole 222 are not limited in position, shape, and number to those shown. Other various embodiments are also possible.

Figure 5:
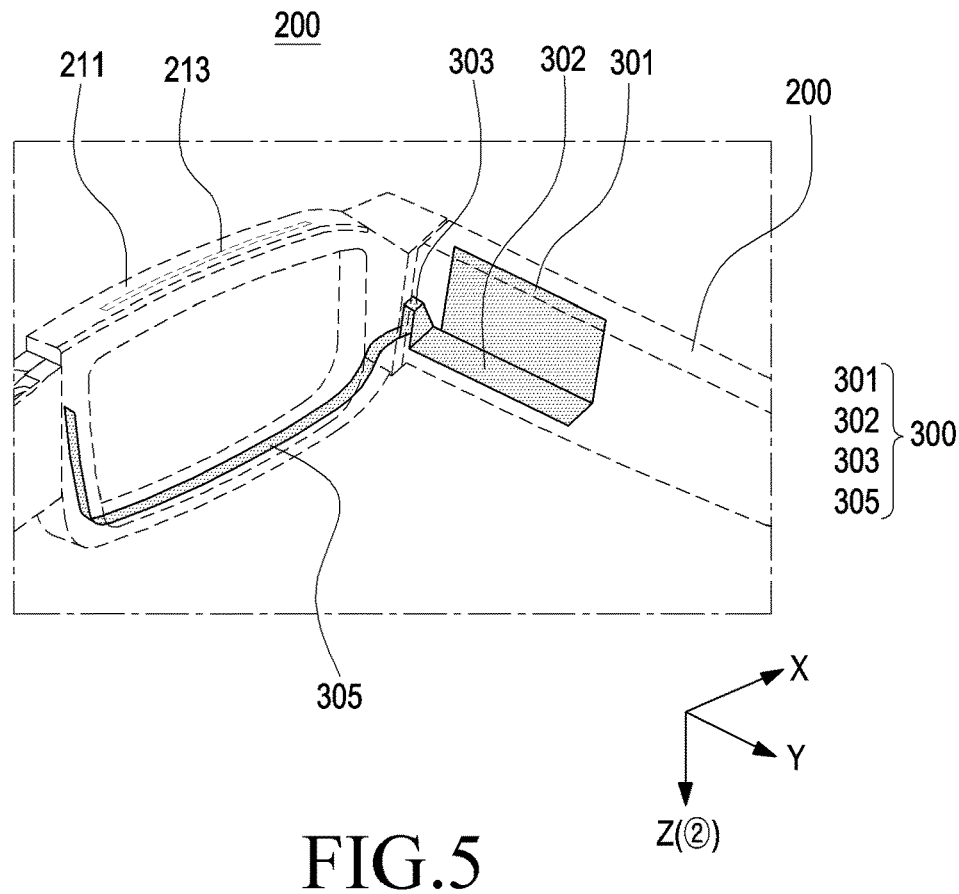
FIG. 5 illustrates a perspective view of a heat radiating member included in an electronic device, according to an embodiment.

FIG. 5 illustrates a perspective view of a heat radiating member 300 included in an electronic device 200, according to an embodiment. At least a portion of the heat radiating member 300 may be disposed adjacent to the light output device 280, and at least another portion of the heat radiating member 300 may extend to a housing (e.g., the first housing 211). Alternatively, the heat radiating member 300 may further include a portion extending from the portion disposed adjacent to the light output device 280 to the other end facing away from the housing 210 in the mounting member 220.

At least a portion of the heat radiating member 300 may be disposed adjacent to the light output device 280, and at least another portion of the heat radiating member 300 may extend to the housing to surround a lower end of the display member 250.

The portion of the heat radiating member 300 which extends to the housing (e.g., the first housing 211) may be formed to surround at least a portion of the lower end of the first glass 251a. At least a portion of the heat radiating member 300 may be formed to be exposed on a space (e.g., the space S of FIG. 7) adjacent to the first glass 251a.

The heat radiating member 300 may be disposed between the first glass 251a and the second glass 251b. For example, the portion of the heat radiating member 300 which extends to the housing (e.g., the first housing 211) may be disposed between a first surface 251a-1 of the first glass 251a and a fourth surface 251b-2 of the second glass 251b. The heat radiating member 300 disposed between the first glass 251a and the second glass 251b may be the whole or part of the heat radiating member 300.

Referring to FIG. 5, the heat radiating member 300 may include heat radiating plates 301 and 302 disposed adjacent to at least one surface of the light output device 280, a bend 303 having at least a bent portion and connected with the heat radiating plates 301 and 302, and a thermal conductive line 305 connected with the bend 303 and extending along the circumference of at least a portion of the first display member 251.

The heat radiating plates 301 and 302 may include a first heat radiating plate 301 and a second heat radiating plate 302. The first heat radiating plate 301 may be formed to touch the broadest surface (e.g., the surface 281) of the light output device 280, and the second heat radiating plate 302 may be formed to touch the surface 282 that is formed to be elongated along the lengthwise direction of the mounting member 220 from the light output device 280. The first heat radiating plate 301 and the second heat radiating plate 302 may radiate heat generated from the light output device 280 to the outside of the mounting member 220. The heat radiating plates 301 and 302 may additionally include heat radiating plates other than the first heat radiating plate 301 and the second heat radiating plate 302.

The bend 303 may be a conductive portion that connects to one end of the heat radiating plate, e.g., the second heat radiating plate 302, and is bent at least one or more times in the position adjacent to the light refracting member 290. The bend 303 may come in various shapes depending on the shape of the hinge connecting the first housing 211 with the mounting member 220. The thermal conductive line 305 may extend from the bend 303 to the first housing 211.

The heat radiating member 300 may transfer heat generated from the light output device 280 to the mounting member 220 and the housing 211 using the heat radiating plates 301 and 302, the bend 303, and the thermal conductive line 305, thereby achieving heat radiation in a quicker and more efficient manner as compared with the prior art. The above-described heat radiating plates 301 and 302, the bend 303, and the thermal conductive line 305 all may be integrally formed together.

The thermal conductive line 305 may be shaped as a band or strip with a relatively small width as compared with that in the lengthwise direction. Thus, the thermal conductive line 305 may more efficiently transfer heat generated from the light output device 280 to the housing (e.g., the first housing 211) which is relatively low in temperature.

A space (e.g., S of FIG. 7) may be formed between the first glass 251a and the second glass 251b. As at least a portion of the thermal conductive line 305 is exposed on the space, the heat transferred to the housing (e.g., the first housing 211) via the thermal conductive line 305 may be radiated over the space, providing an increased heat radiation effect. If the electronic device 200 does not include the second glass 251b, the space S may be formed between the first glass 251a and the housing (e.g., the first housing 211). As shown in FIG. 5, tiny holes 213 may be formed in some surface of the housing (e.g., the first housing 211) to more effectively discharge heat radiated over the space S.

Various embodiments of the disclosure may be described with reference to three coordinate axes X, Y, and Z perpendicular to each other as illustrated in FIG. 5. For example, the X axis may correspond to the direction of arrangement of the first housing 211 and the second housing 212, the Y axis may correspond to the lengthwise direction of the mounting member 220 when the mounting member 220 is in the unfolded state on the first housing 211, and the Z axis may correspond to the height direction of the electronic device 200. The X axis may also be referred to as a first direction ① and the Z axis may also be referred to as a second direction ②.

Figure 6:
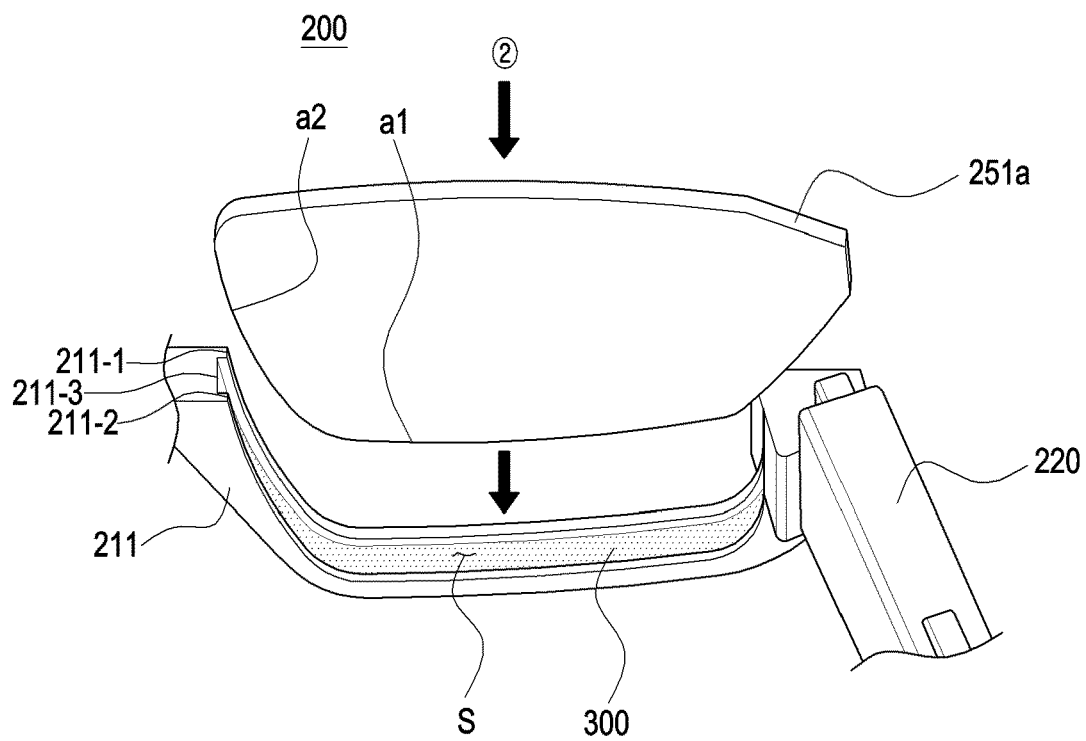
FIG. 6 illustrates glass coupled to a housing of an electronic device, according to an embodiment.

FIG. 6 illustrates glass (e.g., the first glass 251a) coupled to a housing (e.g., the first housing 211) of the electronic device 200, according to an embodiment. FIG. 7 illustrates a cross-sectional view in which the first glass 251a and the second glass 251b are coupled to a housing (e.g., the first housing 211) of the electronic device 200, according to an embodiment.

FIG. 6 illustrates a cross section resulting from cutting a portion of the housing (e.g., the first housing 211) of the electronic device 200 in the first direction ①. FIG. 6 illustrates the electronic device 200 as viewed from the back surface of the first glass 251a. The second glass 251b positioned on the front surface of the electronic device 200 may not be included.

A look at the cross section of the first housing 211 reveals that to form a space S, the first housing 211 may include at least one step portion and a seating surface 211-3 where at least a portion of the heat radiating member 300 is seated on the inner peripheral surface.

FIG. 6 illustrates a step portion 211-1 positioned on the front surface (a first step portion) and a step portion 211-2 positioned on the back surface (a second step portion). The step portions 211-1 and/or 211-2 may have various shapes, numbers, and positions. The seating surface 211-3, as viewed from the cross section of the first housing 211, may lead into the inner peripheral surface of the first housing 211 as compared with at least one step portion (i.e., 211-1 or 211-2), and the heat radiating member 300 may be disposed on the seating surface 211-3. The heat radiating member 300 may correspond to a thermal conductive line 305.

The first glass 251a and/or the second glass 251b may be seated on the inner peripheral surface of the first housing 211 in a direction parallel to the second direction ②. The first glass 251a and/or the second glass 251b may be supported by at least one step portion (i.e., 211-1 or 211-2) so that their positions are fixed.

FIG. 7 illustrates an example in which a cross section of the electronic device 200 resulting from cutting it in the first direction ① is viewed from the second direction ②.

The second glass 251b may form a portion of the outer look of the electronic device 200. The first glass 251a may be a component prepared for providing visual information. The first glass 251a, along with the second glass 251b and/or the first housing 211, may form a space S inside the electronic device 200. At least a portion of the heat radiating member 300 may be exposed over the space S. The heat radiating member 300 may extend long from one side of the mounting member 220 through the right end of the first housing 211 to the left end of the first housing 211. Heat generated as the light output device 280 emits light through the light refracting member 290 to the first glass 251a may effectively be discharged by the heat radiating member 300 exposed to the space S and the first housing 211.

The electronic device may, additionally or instead thereof, include glasses other than the first glass 251a. The electronic device 200 may further include a third glass. For example, with the first glass 251a and the second glass 251b formed as illustrated in FIG. 7, a third glass may be positioned behind the first glass 251a and may be surrounded by the first housing 211. In this case, a space may be formed between the first glass 251a and the third glass. The heat radiating member 300 may be configured to radiate heat via the space formed between the first glass 251a and the third glass. The third glass may be a prescription lens or a safety glass.

FIGS. 8A-8G illustrate cross-sectional views of arrangements of the housing (e.g., the first housing 211), the heat radiating member 300, and the glass (e.g., the first glass 251a and/or the second glass 251b).

Figure 8A:
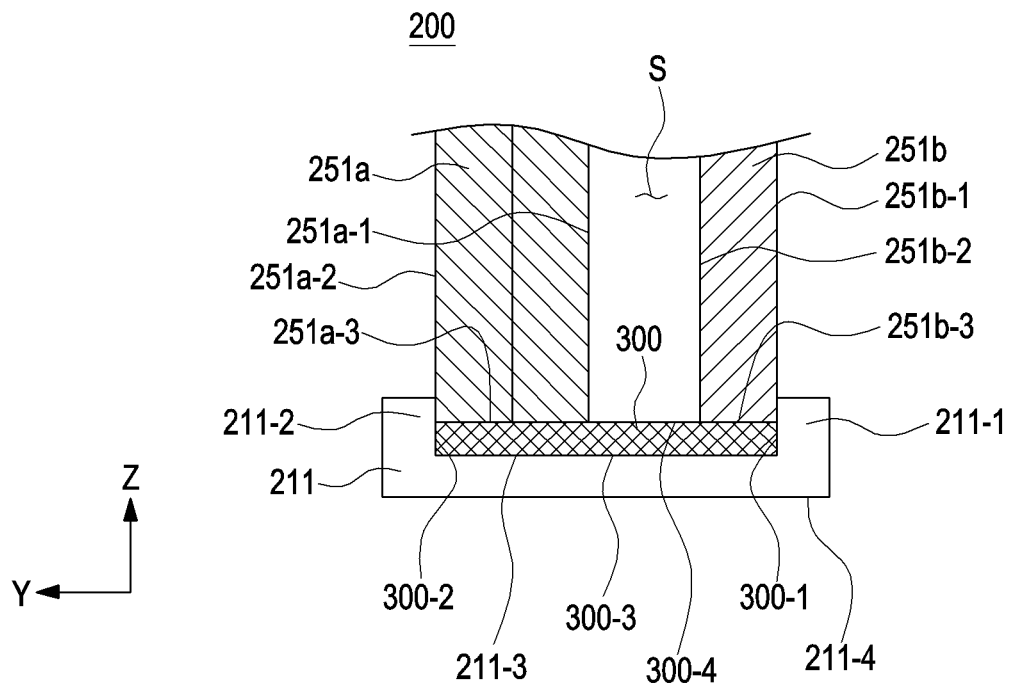
FIG. 8A illustrates a cross-sectional view of an arrangement of a housing, a heat radiating member, and glass, according to an embodiment.
Figure 8B:
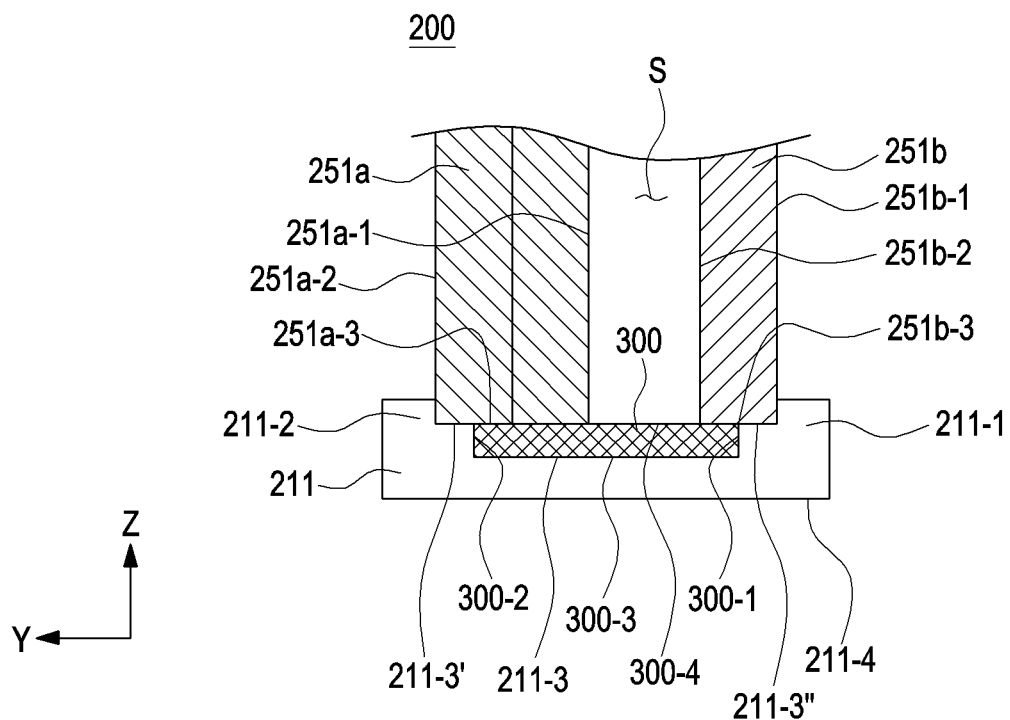
FIG. 8B illustrates a cross-sectional view of an arrangement of a housing, a heat radiating member, and glass, according to an embodiment.
Figure 8C:
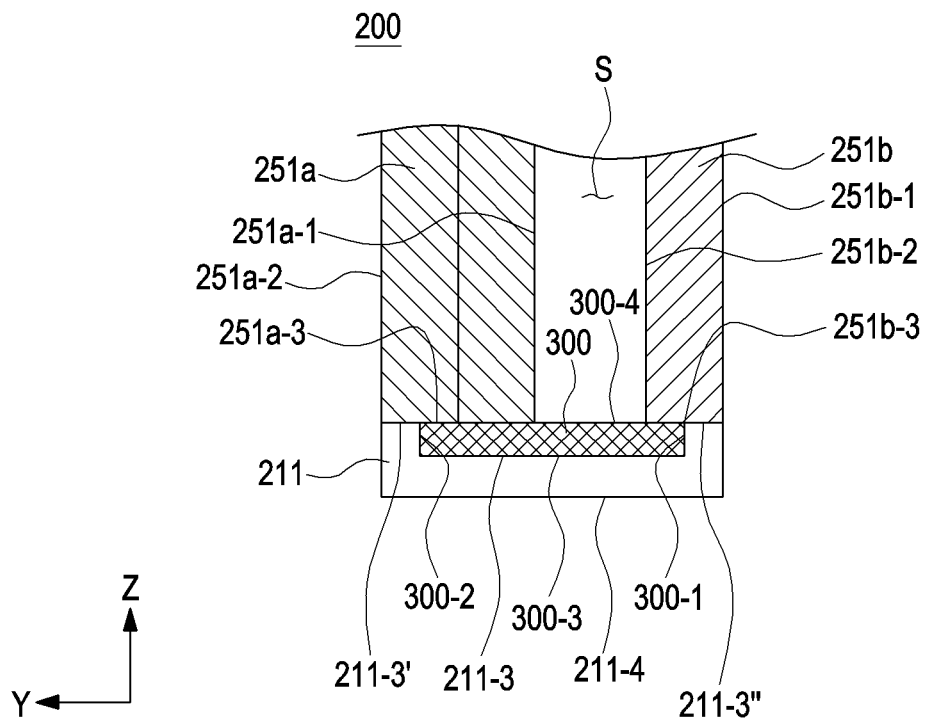
FIG. 8C illustrates a cross-sectional view of an arrangement of a housing, a heat radiating member, and glass, according to an embodiment.
Figure 8D:
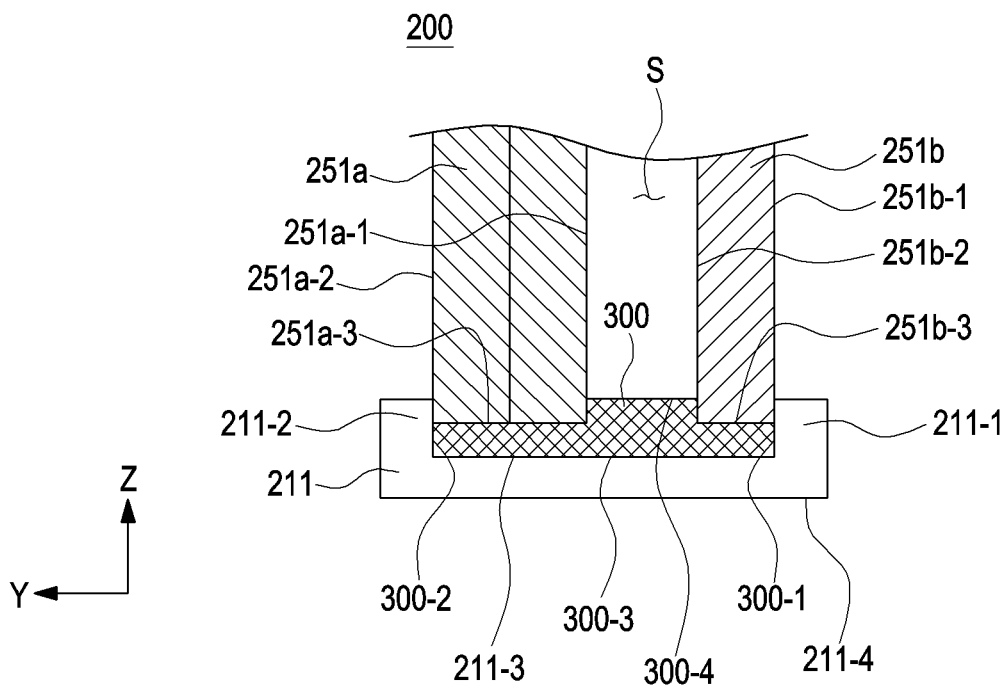
FIG. 8D illustrates a cross-sectional view of an arrangement of a housing, a heat radiating member, and glass, according to an embodiment.
Figure 8E:
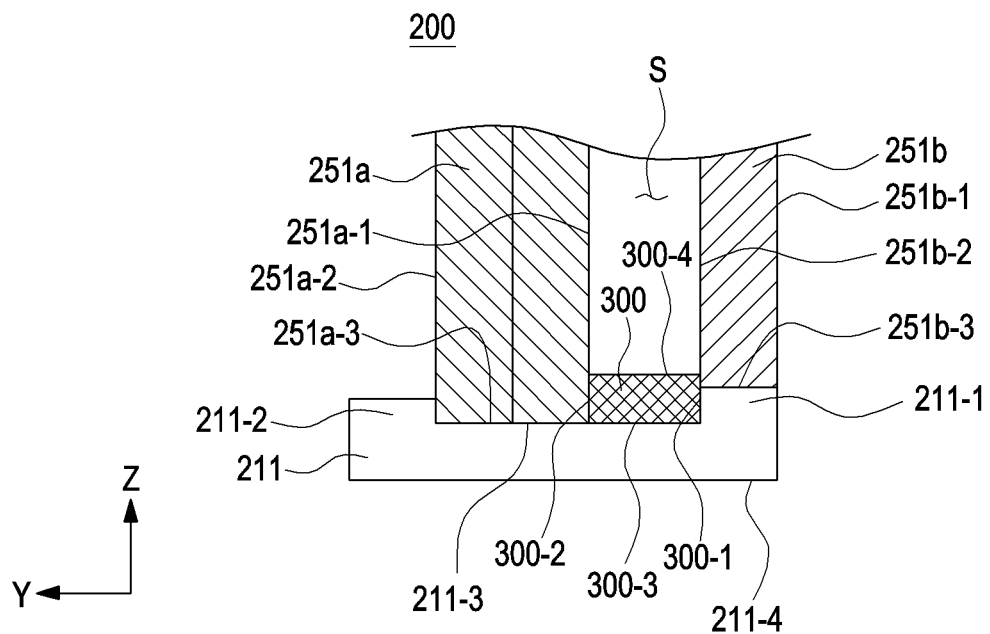
FIG. 8E illustrates a cross-sectional view of an arrangement of a housing, a heat radiating member, and glass, according to an embodiment.
Figure 8F:
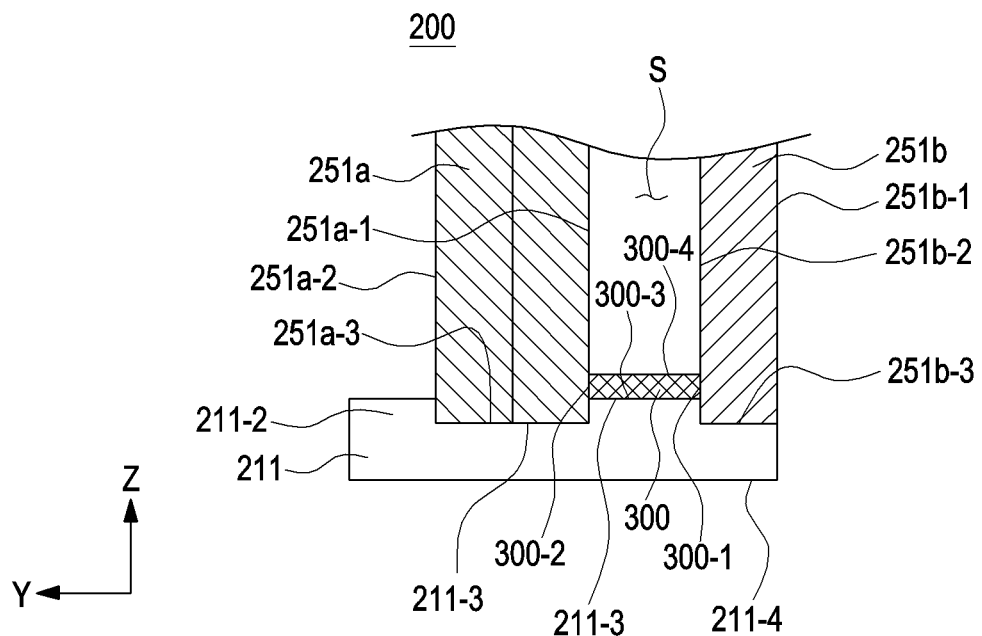
FIG. 8F illustrates a cross-sectional view of an arrangement of a housing, a heat radiating member, and glass, according to an embodiment.
Figure 8G:
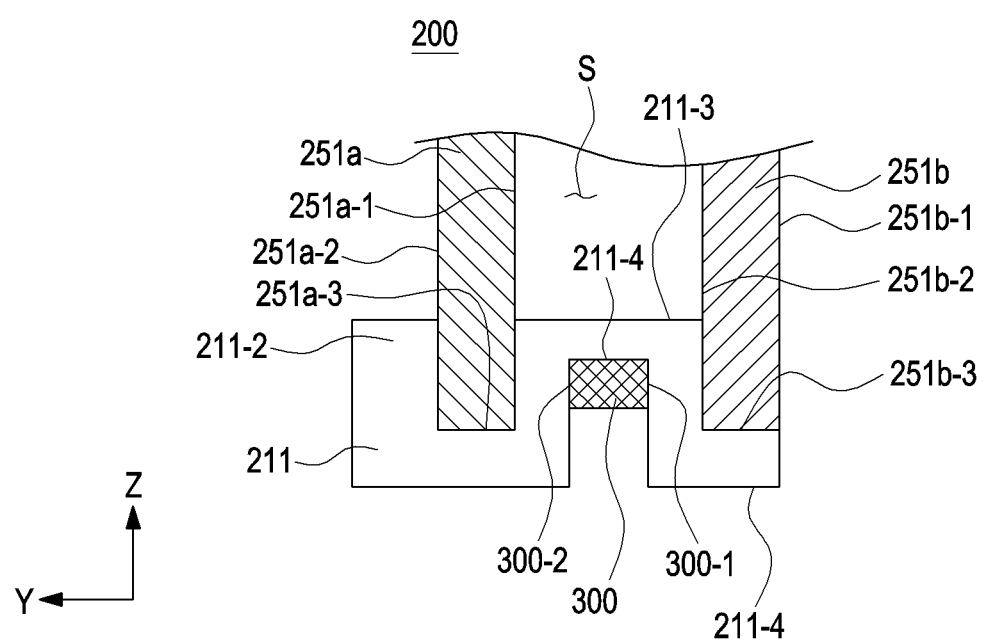
FIG. 8G illustrates a cross-sectional view of an arrangement of a housing, a heat radiating member, and glass, according to an embodiment.

Various placements of the heat radiating member 300 are described below with reference to FIGS. 8A-8G. FIG. 8A illustrates an example in which the heat radiating member 300 touches the overall area of a lower end of the glass (e.g., the first glass 251a and/or the second glass 251b). FIG. 8B illustrates an example in which the heat radiating member 300 touches a portion of a lower end of the glass (e.g., the first glass 251a and/or the second glass 251b). FIG. 8C illustrates an example in which the glass (e.g., the first glass 251a and/or the second glass 251b) is seated, without any step portion, in the first housing 211. FIG. 8D illustrates an example in which at least a portion of the heat radiating member 300 is projected over the space S. FIG. 8E illustrates an example in which the heat radiating member 300 is disposed between two glasses (e.g., the first glass 251a and the second glass 251b). FIG. 8F illustrates an example in which a lower end surface of the heat radiating member 300 is positioned higher than a lower end surface of the glass (e.g., the first glass 251a and/or the second glass 251b). FIG. 8G illustrates an example in which the heat radiating member 300 is formed on the outer peripheral surface of the first housing 211.

The embodiments illustrated in FIGS. 8A-8F may result from cutting the electronic device 200 along the line A-A' illustrated in FIG. 7. Although the following description includes the second glass 251b for ease of description, the second glass 251b which is a component for protecting the exterior of the electronic device 200, may be replaced with another component (e.g., the first housing 211) as long as it performs similar functions to the second glass 251b.

Referring to FIGS. 8A-8G, the first glass 251a may include a first surface 251a-1 and a second surface 251a-2 facing away from the first surface 251a-1. The first glass 251a may include a side end surface 251a-3 formed between the first surface 251a-1 and the second surface 251a-2. The second glass 251b may include a third surface 251b-1 and a fourth surface 251b-2 facing away from the third surface 251b-1. The second glass 251b may also include a side end surface 251b-3 formed between the third surface 251b-1 and the fourth surface 251b-2. As described above, the side end surface of the first glass 251a may be referred to as a first side end surface 251a-3, and the side end surface of the second glass 251b may be referred to as a second side end surface 251b-3.

The first housing 211 may include a first step portion 211-1 and/or a second step portion 211-2, a seating surface 211-3, and an outer peripheral surface 211-4. The first step portion 211-1 and/or the second step portion 211-2 and the seating surface 211-3 may constitute an inner peripheral surface that faces away from the outer peripheral surface 211-4. Although in FIGS. 8A-8G, the first housing 211 may include the first step portion 211-1 and the second step portion 211-2 as at least one step portion, embodiments of the disclosure are not limited to those shown in the drawings. For example, the first glass 251a may be disposed over the first step portion 211-1, and the second glass 251b may be stuck to the second step portion 211-2 so that the second glass 251b does not move.

In the embodiments of FIGS. 8A-8C, the heat radiating member 300 includes first surface 300-1 and second surface 300-2 that touch the inner peripheral surface of the first housing 211 and may further include a third surface 300-3 that touches the seating surface 211-3 of the first housing 211. The heat radiating member 300 may touch the side end surface 251a-3 of the glass (e.g., the first glass 251a and/or the second glass 251b) and at least a portion 300-4 thereof may be exposed over the space S. The heat radiating member 300 may be formed to at least partially touch the first side end surface 251a-3 of the first glass 251a and to at least partially touch the second side end surface 251b-3 of the second glass 251b. The heat radiating member 300 may have a portion 300-4 exposed over the space S between the portion touching the first side end surface 251a-3 of the first glass 251a and the portion touching the second side end surface 251b-3 of the second glass 251b.

As illustrated in FIG. 8D, at least a portion 300-4 of the heat radiating member 300 may be shaped to project over (i.e., come into contact with) the space S.

In the embodiments of FIGS. 8E-8G, the heat radiating member 300 may be disposed between the first surface 251a-1 of the first glass 251a and the fourth surface 251b-2 of the second glass 251b and may include a second surface 300-2 touching the first surface 251a-1 of the first glass 251a and a first surface 300-1 touching the fourth surface 251b-2 of the second glass 251b. The heat radiating member 300 may further include a third surface 300-3 that touches the first housing 211.

The electronic device 200 may effectively radiate heat which is transferred via the mounting member 220 to the first housing 211 using the heat radiating member 300. At least a portion 300-4 of the heat radiating member 300 may be exposed over the space S formed by the first glass 251a, the second glass 251b, and the first housing 211. In addition, the heat radiating member 300 may radiate heat through the space S, which is lower in temperature.

Not only does the heat radiating member 300 form the above-described heat radiating structure, but the heat radiating member 300 may also form a structure that prevents the user from being exposed to high-temperature heat from the heat radiating member 300 when at least a portion of the heat radiating member 300 is disposed between the first glass 251a and the second glass 251b. As viewed from the cross section of the housing (e.g., the first housing 211), the seating surface 211-3 of the housing, where at least a portion of the heat radiating member 300 is seated, may be formed in a position that is higher than the height of at least one of the side end surface 251a-3 of the first glass 251a and the side end surface 251b-3 of the second glass 251b.

Referring to FIG. 8E, the third surface 300-3 of the heat radiating member 300 which touches the first housing 211 may touch the seating surface 211-3 of the first housing 211. The seating surface 211-3 may be formed to touch each of the third surface 300-3 of the heat radiating member 300 and the side end surface 251a-3 of the first glass 251a at the same level (e.g., height or width).

Unfortunately, when heat generated from the light output device 280 is transferred to the heat radiating member 300, most of the thermal energy of the heat radiating member 300 may be discharged over the space S, but part of the thermal energy of the heat radiating member 300 may be delivered to the skin (e.g., the cheeks) of the user wearing the electronic device 200 via the first housing 211. If high-temperature heat is delivered to the user's skin, the user may have difficulty using of the electronic device 200 for an extended period of time. To prevent this, the heat radiating member 300 may be formed so that its third surface 300-3 (e.g., lower end surface) is positioned closer to the housing (e.g., the first housing 211) than to the side end surface of the glass (e.g., the first glass 251a). For example, as shown in FIG. 8E, the third surface 300-3 of the heat radiating member 300 may be positioned at the same level (e.g., height or width) as the first side end surface 251a-3 with respect to the outer peripheral surface 211-4 of the first housing 211. When the heat radiating member 300 is formed such that heat is not projected to the housing (e.g., the first housing 211) through the glass (e.g., the first glass 251a), an influence of the heat from the heat radiating member 300 on the user may be reduced.

FIG. 8F illustrates an alternate position of the heat radiating member 300.

Referring to FIG. 8F, the third surface 300-3 of the heat radiating member 300, as viewed from the cross section of the first housing 211, may be formed in a position that is higher than the first side end surface 251a-3 and the second side end surface 251b-3 with respect to the outer peripheral surface 211-4 of the first housing 211. As the heat radiating member 300 is formed farther away than the first side end surface 251a-3 and/or the second side end surface 251b-3 of the first glass 251a and/or the second glass 251b, a reduction in the influence on the user's skin by the heat from the heat radiating member 300 may be achieved.

FIG. 8G illustrates an alternate position of the heat radiating member 300.

Referring to FIG. 8G, the heat radiating member 300 is disposed on a groove formed in the outer peripheral surface 211-4 of the first housing 211. The opposite surface (which faces away from the third surface 300-3) of the heat radiating member 300 may be formed to touch the outer peripheral surface 211-4 of the first housing 211. The third surface 300-3 of the heat radiating member 300 may be formed in a position that is higher than the first side end surface 251a-3 and the second side end surface 251b-3 with respect to the outermost peripheral surface of the outer circumferential surfaces of the first housing 211. As the heat radiating member 300 is formed farther away from the first end surface 251a-3 and/or the second end surface 251b-3 of the first glass 251a and/or the second glass 251b, a reduction in the influence on the user's skin by the heat from the heat radiating member 300 may be achieved.

The technical features of the position of the heat radiating member 300 as described above in connection with FIGS. 8A-8G may be achieved when the heat radiating member 300 is positioned on a side (e.g., a lateral side a2 or a lower side a1) of the first display member 251 (or the first housing 211). If the heat radiating member 300 is positioned on an upper side of the first display member 2851, an influence on the user may be relatively small as compared to when the heat radiating member 300 is positioned on a lateral side a2 or a lower side a1 of the first display member 251.

Figure 9A:
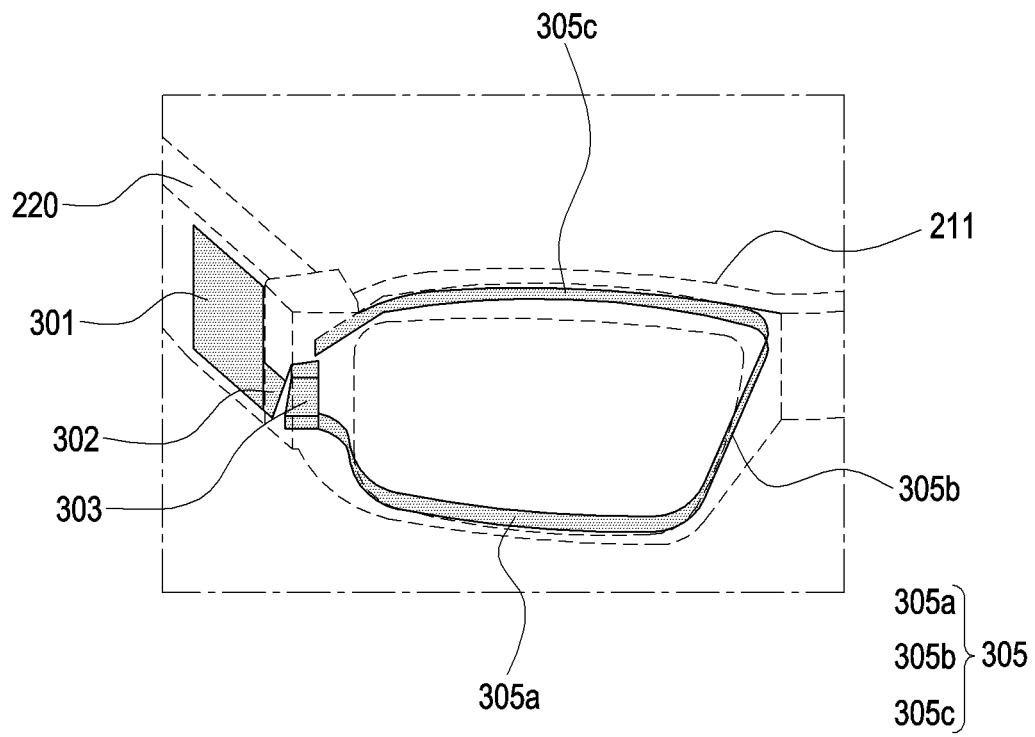
FIG. 9A illustrates a perspective view of a heat radiating member formed along a frame-shaped housing, according to an embodiment.
Figure 9B:
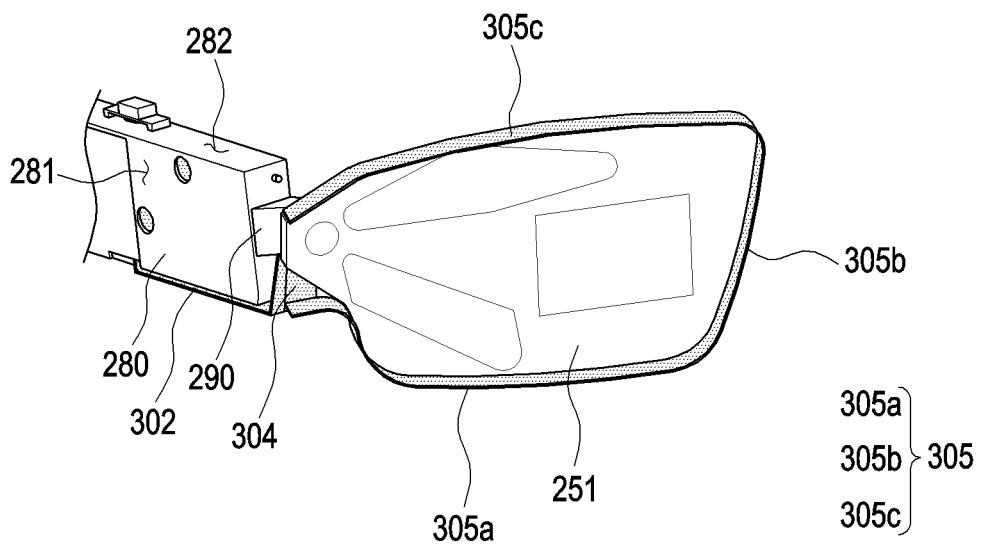
FIG. 9B illustrates a perspective view of a heat radiating member formed along glass, according to an embodiment.

FIG. 9A illustrates a perspective view of a heat radiating member 300 formed along a frame-shaped housing 211, according to an embodiment. FIG. 9B illustrates a perspective view of a heat radiating member 300 formed along glass, according to an embodiment.

Referring to FIGS. 9A and 9B, the heat radiating member 300 may include a first heat radiating plate 301 and a second heat radiating plate 302 (heat radiating plates 301 and 302) disposed adjacent to at least one surface of the light output device 280, a bend 303 having at least a bent portion and connected with the heat radiating plates 301 and 302, and a thermal conductive line 305 connected with the bend 303 and extending along the circumference of at least a portion of the first display member 251 (or the first housing 211).

The heat radiating member 300 may include the thermal conductive line 305 that extends to substantially surround the overall first display member 251.

The thermal conductive line 305 may extend along the frame-shaped first housing 211 as shown in FIG. 9A. The thermal conductive line 305 may extend downwards (or upwards) from the bend at one end of the first housing 211, pass the other end of the first housing 211, and then integrally extend upwards (or downwards) along the first housing 211. The thermal conductive line 305 may include a first thermal conductive line 305a positioned on a lower side of the first housing 211 with respect to the center of the first display member 251, a second thermal conductive line 305b positioned on a lateral side of the first housing 211 with respect to the center of the first display member 251, and a third thermal conductive line 305c positioned on an upper side of the first housing 211 with respect to the center of the first display member 251. The first thermal conductive line 305a, the second thermal conductive line 305b, and the third thermal conductive line 305c may be integrally formed together.

The heat radiating member 300 includes the first thermal conductive line 305a, the second thermal conductive line 305b, and the third thermal conductive line 305c to surround the first display member 251, and the first thermal conductive line 305a may be connected with the bend 304.

Figure 10A:
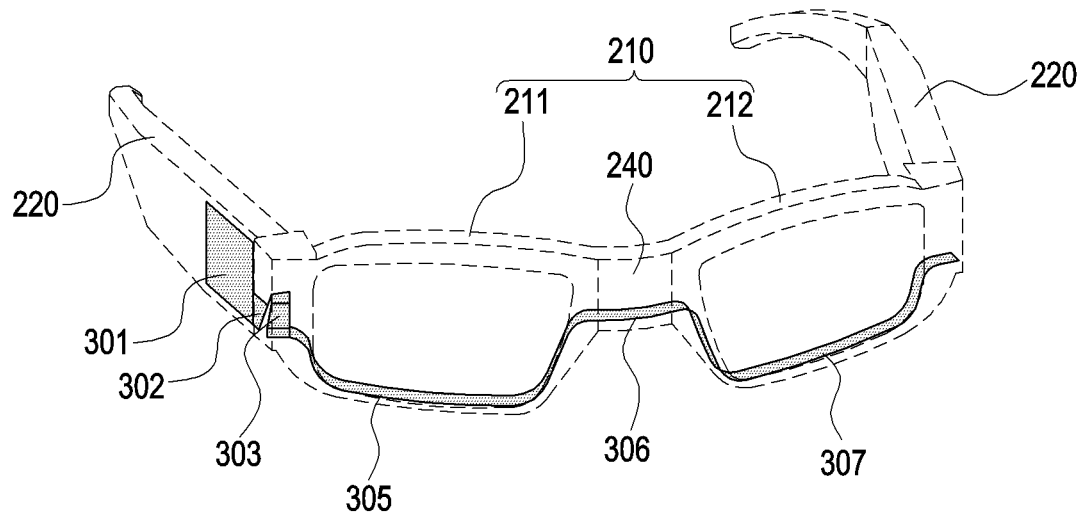
FIG. 10A illustrates a perspective view of a heat radiating member formed over a first housing, a connecting member, and a second housing, according to an embodiment.
Figure 10B:
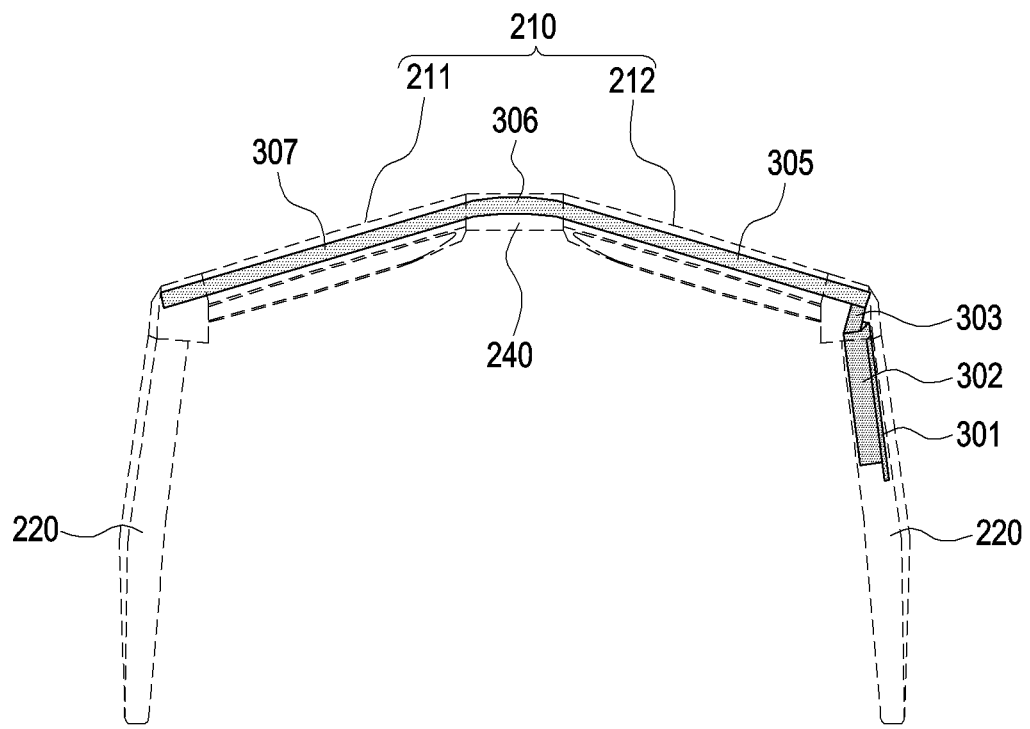
FIG. 10B illustrates a heat radiating member formed over a first housing, a connecting member, and a second housing, as viewed from above the electronic device, according to an embodiment.

FIG. 10A illustrates a perspective view of a heat radiating member 300 formed over a first housing 211, a connecting member 240, and a second housing 212, according to an embodiment. FIG. 10B illustrates a heat radiating member 300 formed over a first housing 211, a connecting member 240, and a second housing 212, as viewed from above the electronic device 200, according to an embodiment.

Referring to FIGS. 10A-10B, the heat radiating member 300 may be formed in the first housing 211 and the second housing 212. For example, the heat radiating member 300 extending from any one of the pair of mounting members 220 provided in the electronic device 200 may extend to the first housing 211, then through the connecting member 240 to the second housing 212.

The heat radiating member 300 may include a thermal conductive line 305 extending to the first housing 211, a line 306 passing through the connecting member 240, and a thermal conductive line 307 extending to the second housing 212.

The electronic device 200 may include a pair of heat radiating members individually extending from a pair of mounting members 220 to a plurality of housings (e.g., the first housing 211 and the second housing 212). Alternatively, as shown in FIGS. 10A and 10B, a single heat radiating member 300 may be used to transfer heat from the light output device 280 to the connecting member 240, the first housing 211 and the second housing 212.

Since at least a portion (e.g., the thermal conductive line 305) of the heat radiating member 300 is exposed to the space S as shown in FIGS. 8A-8G, the heat radiating member 300 may form an efficient heat radiating structure. Also, since at least a portion (e.g., the thermal conductive line 305) of the heat radiating member 300 may be shaped to surround the display member (e.g., the first display member 251) or to extend from one housing (e.g., the first housing 211) to another nearby housing (e.g., the second housing 212), as shown in FIGS. 9A-10B, the heat radiating member 300 may form an efficient heat radiating structure.

Figure 11:
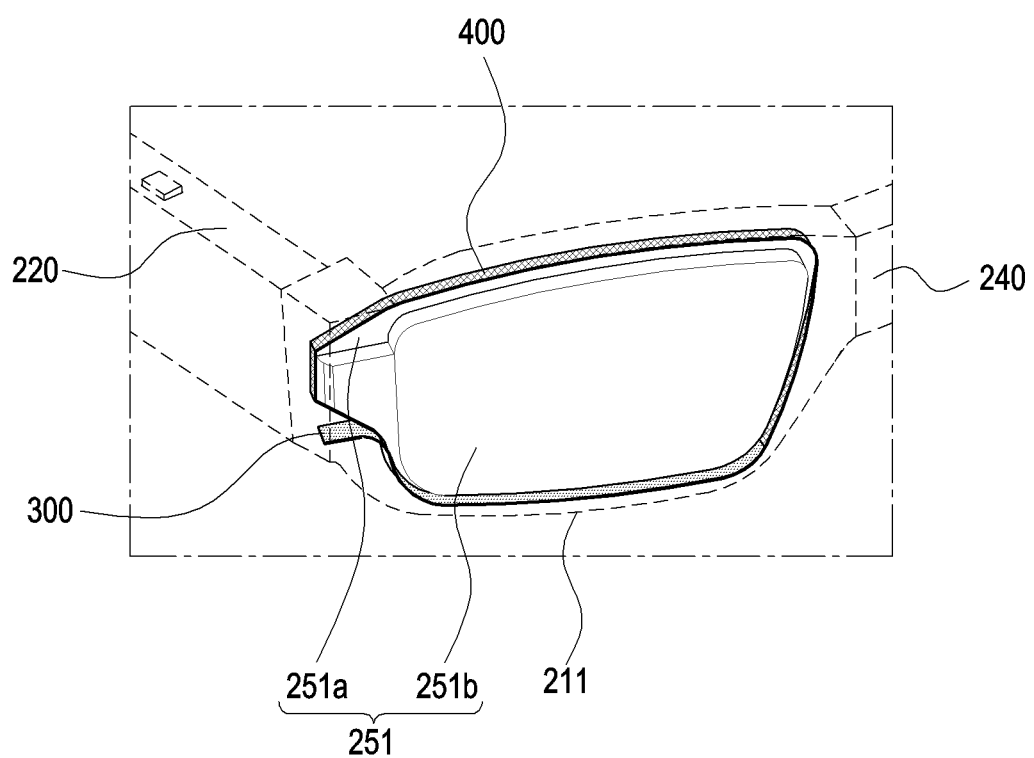
FIG. 11 illustrates a perspective view of a heat radiating member and a masking member, according to an embodiment.

FIG. 11 illustrates a perspective view of a heat radiating member 300 and a masking member 400, according to an embodiment.

The electronic device 200 may further include a masking member 400 that prevents leakage of light emitted from the light output device 280 to the outside of the electronic device 200, thereby allowing the light to form an image on the glass (e.g., the first glass 251a). To achieve this, the masking member 400 may be shaped to surround at least a portion of the glass (e.g., the first glass 251a).

A thermal conductive material may be applied to the masking member 400, and the thermal conductive line 305 of the heat radiating member 300 may be disposed to surround the first display member 251. The masking member 400 may be connected to the thermal conductive line 305 to allow the masking member 400 to substantially function as a thermal conductive line and to prevent light leakage.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic device is not limited to the above-listed embodiments.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, an electronic device 200 includes a display member 250 including at least one piece of glass (e.g., the first glass 251a and/or second glass 251b), a housing 210 surrounding at least a portion of the display member 250 to form a space inside the electronic device 200, a mounting member 220 coupled to at least one side of the housing, a light output device 280 disposed inside the mounting member 220 to output light to the display member 250, a light refracting member (e.g., the light refracting member 290 and/or 291) refracting light emitted from the light output device 280, and a heat radiating member 300 including at least a first portion disposed adjacent to the light output device 280 and at least a second portion extending to the housing 210 to surround at least a portion of the piece of glass, the heat radiating member 300 including a portion at least partially contacting the space.

The display member 250 may include a first piece of glass 251a including a first surface 251a-1 and a second surface 251a-2 facing away from the first surface and a second piece of glass 251b including a third surface 251b-1 and a fourth surface 251b-2 facing away from the third surface 251b-1 and spaced a predetermined distance apart from the first surface 251a-1 of the first piece of glass 251a to face the first surface 251a-1.

The heat radiating member 300 may include a thermal conductive line 305 extending along a circumference of at least a portion of the display member 250.

The heat radiating member 300 may include a thermal conductive line 305 extending to surround substantially the overall display member 250.

The housing 210 may include at least one step portion and a seating surface 211-3 where at least a portion of the heat radiating member 300 is seated in an inner peripheral surface and wherein, as viewed from a cross section of the housing 210, an exposed surface 300-4 of the heat radiating member 300 on the space is formed in a position that is higher than a side end surface of the at least one piece of glass.

The housing 210 may include a groove in an outer peripheral surface. The heat radiating member 300 may be disposed in the groove.

The heat radiating member 300 may include a heat radiating plate (e.g., the first heat radiating plate 301 and/or the second heat radiating plate 302) disposed adjacent to at least one surface of the light output device 280, a bend 303 connected to the heat radiating plate and having at least a bent portion, and a thermal conductive line 305 connected with the bend 303 and extending along a circumference of at least a portion of the display member 250.

The heat radiating member 300 may further include a first heat radiating plate 301 disposed adjacent to at least one surface of the light output device 280 and a second heat radiating plate 302 disposed adjacent to at least another surface of the light output device 280.

The housing may include a first housing 211 and a second housing 212 connected with the first housing 211 via a connecting member 240.

The display member 250 may include a first display member 251 having at least a portion covered by the first housing 211 and a second display member 252 having at least a portion covered by the second housing 212.

The heat radiating member 300 may be formed to pass through the first housing 211, the connecting member 240, and the second housing 212.

The heat radiating member 300 may include a pair of heat radiating members, wherein the pair of heat radiating members, are respectively connected to the first housing 211 and the second housing 212.

The electronic device 200 may further include a masking member 400, wherein at least a portion of the masking member 400 is disposed along a circumference of the display member 250 and includes a thermal conductive material.

The piece of first glass 251a may be a waveguide glass.

The display member 250 may further include a third piece of glass spaced a predetermined distance apart from the second surface 251a-2 of the first piece of glass 251a.

According to an embodiment, an electronic device 200 includes a display member 250, a housing 210 surrounding at least a portion of the display member 250, a mounting member 220 coupled to at least one side of the housing 210, a light output device 280 disposed inside at least one side of the mounting member 220 to output light to the display member 250, a light refracting member (e.g., the light refracting member 290 and/or 291) refracting light emitted from the light output device 280 to the display member 250, and a heat radiating member 300 including at least a first portion disposed adjacent to the light output device 280 and at least a second portion extending to the housing 210 to surround a lower end of the display member 250.

The display member 250 may include a first piece of glass 251a including a first surface 251a-1 and a second surface 251a-2 facing away from the first surface 251a-1 and a second piece of glass 251b including a third surface 251b-1 and a fourth surface 251b-2 facing away from the third surface 251b-1 and spaced a predetermined distance apart from the first surface 251a-1 of the first piece of glass to face the first surface 251a-1.

The heat radiating member 300 may include a thermal conductive line 305 extending along a circumference of at least a portion of the display member 250.

The heat radiating member 300 may include a first heat radiating plate 301 disposed adjacent to at least a first surface of the light output device 280, a second heat radiating plate 302 disposed adjacent to at least a second surface of the light output device 280, a bend 303 connected to the first heat radiating plate 301 and the second heat radiating plate 302 having at least a bent portion, and a thermal conductive line 305 connected with the bend 303 and extending along a circumference of at least a portion of the display member 250.

The housing 210 may include at least one step portion and a seating surface where at least a portion of the heat radiating member 300 is seated in an inner peripheral surface and wherein as viewed from a cross section of the housing 210, a surface of the heat radiating member 300 that is exposed to a space surrounded by the housing 210 and the display member 250, is formed in a position that is higher than a side end surface of the piece of glass seated on the seating surface.

As is apparent from the foregoing description, according to various embodiments, an electronic device has a heat radiating member 300 disposed around the display member 250 which provides visual information to the user, thus delivering a higher heat radiating efficiency as compared with the prior art.

According to various embodiments, it is possible to minimize the influence of heat generated and radiated from the light output device 280 on the user.

While the disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic device, comprising:
a display member including at least one piece of glass;
a housing surrounding at least a portion of the display member to form a space inside the electronic device;
a mounting member coupled to at least one side of the housing;
a light output device disposed inside the mounting member to output light to the display member;
a light refracting member refracting light emitted from the light output device; and
a heat radiating member including at least a first portion disposed adjacent to the light output device and at least a second portion extending to the housing to surround at least a portion of the at least one piece of glass, wherein at least a part of the heat radiating member contacts the space,
wherein the housing includes at least one step portion and a seating surface where at least one of the first portion or the second portion of the heat radiating member is seated in an inner peripheral surface, and
wherein, as viewed from a cross section of the housing, and exposed surface of the heat radiating member on the space is formed in a position that is higher than a side end surface of the at least one piece of glass.

2. The electronic device of claim 1, wherein the at least one piece of glass included in the display member includes a first piece of glass including a first surface and a second surface facing away from the first surface and a second piece of glass including a third surface and a fourth surface facing away from the third surface and spaced a predetermined distance apart from the first surface of the first piece of glass to face the first surface.

3. The electronic device of claim 2, wherein the first piece of glass is a waveguide glass.

4. The electronic device of claim 2, wherein the display member further includes a third piece of glass spaced a predetermined distance apart from the second surface of the first piece of glass.

5. The electronic device of claim 1, wherein the heat radiating member further includes a thermal conductive line extending along a circumference of at least the portion of the display member.

6. The electronic device of claim 5, wherein the heat radiating member further includes a thermal conductive line extending to surround the display member.

7. The electronic device of claim 1, wherein the housing includes a groove in an outer peripheral surface and the heat radiating member is disposed in the groove.

8. The electronic device of claim 1, wherein the heat radiating member further includes:
- a heat radiating plate disposed adjacent to at least one surface of the light output device,
- a bend connected to the heat radiating plate and having a bent portion, and
- a thermal conductive line connected with the bend and extending along a circumference of at least the portion of the display member.

9. The electronic device of claim 8, wherein the heat radiating member further includes a first heat radiating plate disposed adjacent to at least a first surface of the light output device and a second heat radiating plate disposed adjacent to at least a second surface of the light output device.

10. The electronic device of claim 1, wherein the housing includes a first housing and a second housing connected with the first housing via a connecting member.

11. The electronic device of claim 10, wherein the display member further includes a first display member having at least a portion covered by the first housing and a second display member having at least a portion covered by the second housing.

12. The electronic device of claim 10, wherein the heat radiating member is formed to pass through the first housing, the connecting member, and the second housing.

13. The electronic device of claim 10, wherein the heat radiating member further includes a pair of heat radiating members respectively connected to the first housing and the second housing.

14. The electronic device of claim 1, further comprising a masking member,
wherein at least a portion of the masking member disposed along a circumference of the display member includes a thermal conductive material.

15. An electronic device, comprising:
a display member;
a housing surrounding at least a portion of the display member;
a mounting member coupled to at least one side of the housing;
a light output device disposed inside at least one side of the mounting member to output light to the display member;
a light refracting member refracting light emitted from the light output device to the display member; and
a heat radiating member including at least a first portion disposed adjacent to the light output device and at least a second portion extending to the housing to surround a lower end of the display member,
wherein the housing includes at least one step portion and a seating surface where at least one of the first portion or the second portion of the heat radiating member is seated in an inner peripheral surface, and
wherein, as viewed from a cross section of the housing, a surface of the heat radiating member, that is exposed to a space surrounded by the housing and the display member, is formed in a position that is higher than a side end surface of a piece of glass that is seated on the seating surface.

16. The electronic device of claim 15, wherein the display member includes:
a first piece of glass including a first surface and a second surface facing away from the first surface; and
a second piece of glass including a third surface and a fourth surface facing away from the third surface and spaced a predetermined distance apart from the first surface of the first piece of glass to face the first surface.

17. The electronic device of claim 15, wherein the heat radiating member further includes a thermal conductive line extending along a circumference of at least the portion of the display member.

18. The electronic device of claim 15, wherein the heat radiating member further includes:
a first heat radiating plate disposed adjacent to at least a first surface of the light output device,
a second heat radiating plate disposed adjacent to at least a second surface of the light output device,
a bend connected to the first heat radiating plate and the second heat radiating plate and having a bent portion, and
a thermal conductive line connected with the bend and extending along a circumference of at least the portion of the display member.

* * * * *